(12) United States Patent
Hazama

(10) Patent No.: US 6,787,844 B2
(45) Date of Patent: *Sep. 7, 2004

(54) SEMICONDUCTOR DEVICE INCLUDING TRANSISTOR WITH COMPOSITE GATE STRUCTURE AND TRANSISTOR WITH SINGLE GATE STRUCTURE, AND METHOD FOR MANUFACTURING THE SAME

(75) Inventor: Katsuki Hazama, Tokyo (JP)

(73) Assignee: Nippon Steel Corporation (JP)

( * ) Notice: Subject to any disclaimer, the term of this patent is extended or adjusted under 35 U.S.C. 154(b) by 72 days.

This patent is subject to a terminal disclaimer.

(21) Appl. No.: 10/118,039

(22) Filed: Apr. 9, 2002

(65) Prior Publication Data

US 2002/0137285 A1 Sep. 26, 2002

Related U.S. Application Data

(62) Division of application No. 09/706,810, filed on Nov. 7, 2000, now Pat. No. 6,525,370, which is a division of application No. 09/317,255, filed on May 24, 1999, now abandoned, which is a division of application No. 08/720,014, filed on Sep. 27, 1996, now Pat. No. 5,925,907.

(30) Foreign Application Priority Data

Sep. 29, 1995 (JP) .......................................... 07-276292

(51) Int. Cl.[7] ...................... H01L 29/792; H01L 31/062
(52) U.S. Cl. ...................... 257/324; 257/356; 257/357; 257/369; 257/383
(58) Field of Search ................................ 257/324–329, 257/383, 369

(56) References Cited

U.S. PATENT DOCUMENTS

| | | | |
|---|---|---|---|
| 4,453,388 A | 6/1984 | Baker et al. ................. 538/266 |
| 4,894,802 A | 1/1990 | Hsia et al. ................... 365/185 |
| 4,958,321 A | 9/1990 | Chang ........................ 365/185 |
| 5,034,798 A | 7/1991 | Ohsima ....................... 257/324 |
| 5,200,636 A | * 4/1993 | Uemura et al. .............. 257/315 |
| 5,229,631 A | 7/1993 | Woo ........................... 257/315 |
| 5,321,287 A | * 6/1994 | Uemura et al. .............. 257/316 |
| 5,493,139 A | * 2/1996 | Akiyama et al. ........... 257/316 |
| 5,541,876 A | 7/1996 | Hsue et al. .................. 257/314 |
| 5,637,897 A | * 6/1997 | Oyama ........................ 257/320 |
| 5,691,561 A | 11/1997 | Goto ........................... 257/383 |
| 5,793,673 A | 8/1998 | Pio et al. .................... 257/316 |
| 6,121,670 A | * 9/2000 | Hisamune .................... 257/623 |
| 6,157,575 A | * 12/2000 | Choi ....................... 365/185.29 |
| 6,365,457 B1 | * 4/2002 | Choi ........................... 438/258 |
| 6,417,086 B1 | * 7/2002 | Osari .......................... 438/594 |
| 6,451,643 B2 | * 9/2002 | Komori et al. ............. 438/211 |

FOREIGN PATENT DOCUMENTS

| | | |
|---|---|---|
| EP | 000 581 312 A1 | 2/1994 |
| JP | A-59-74677 | 4/1984 |
| JP | A-5-48046 | 2/1993 |
| JP | A-7-183411 | 7/1995 |

* cited by examiner

Primary Examiner—Michael Lebentritt
(74) Attorney, Agent, or Firm—Connolly, Bove, Lodge & Hutz LLP

(57) ABSTRACT

A semiconductor device comprises a first transistor having a composite gate structure containing a lamination of a first polycrystalline silicon film, an interlayer insulating film, and a second polycrystalline silicon film; and a second transistor having a single gate structure containing a lamination of a third polycrystalline silicon film and a fourth polycrystalline silicon film, wherein the first polycrystalline silicon film and the third polycrystalline silicon film have substantially the same thickness; the first polycrystalline silicon film and the third polycrystalline silicon film have different impurity concentrations controlled independently of each other; the second polycrystalline silicon film and the fourth polycrystalline silicon film have substantially the same thickness, and the second polycrystalline silicon film, the fourth polycrystalline silicon film, and the third polycrystalline silicon film have substantially the same impurity concentration. Also, a method for manufacturing the above-described semiconductor device is described.

13 Claims, 4 Drawing Sheets

SEMICONDUCTOR DEVICE INCLUDING TRANSISTOR WITH COMPOSITE GATE STRUCTURE AND TRANSISTOR WITH SINGLE GATE STRUCTURE, AND METHOD FOR MANUFACTURING THE SAME

CROSS-REFERENCE APPLICATION

The present application is a divisional application of U.S. Appl. No. 09/706,810, filed Nov. 7, 2000 (now U.S. Pat. No. 6,525,370), which is a divisional application of 09/317,255, filed May 24, 1999 (now abandoned), which it a divisional application of 08/720,014, filed Sep. 27, 1996 (now U.S. Pat. No. 5,925,907).

BACKGROUND OF THE INVENTION

1. Field of the Invention

The present invention generally relates to a semiconductor device including a transistor with a composite gate structure and a transistor with a single gate structure, and to a method for manufacturing such a semiconductor device. More specifically, the present invention relates to a nonvolatile semiconductor memory device including a nonvolatile memory cell having a composite gate structure of a floating gate and a control gate, and a transistor having a single gate structure of only a control gate, and also a method for manufacturing such a nonvolatile semiconductor memory device.

2. Description of the Related Art

Among nonvolatile semiconductor memory devices in which information stored therein can not be erased even when power sources are turned OFF, the information can be electrically written into the respective memory cells of EPROMs (Electrically Programmable Read-Only Memories), whereas the information can be electrically written into the respective memory cells as well as can be electrically erased from each of these memory cells in EEPROMs (Electrically Erasable Programmable Read-Only Memories).

In general, as a memory cell for such an EPROM and an EEPROM, a MOS transistor with a composite gate structure is employed. The composite gate structure is constituted by stacking a floating gate electrode and a control gate electrode which are made of polycrystalline silicon films with an insulating film interposed therebetween. On the other hand, as a gate electrode of a single gate structure of another MOS transistor other than the memory cell transistor formed in, for example, a peripheral circuit region, two layers of polycrystalline silicon films, which are made simultaneously with forming of the floating gate and the control gate of the memory cell transistor, are utilized so that the steps in manufacturing of the transistor can be simplified. Such a semiconductor memory device structure is disclosed in, for instance, JP-A-59-74677, JP-A-7-183411, and JP-A-548046.

In JP-A-59-74677, the composite gate containing the floating gate and the control gate of the memory transistor, and the single gate structure of the peripheral transistor are both formed by three layers of a first polycrystalline silicon film, an insulating film, and a second polycrystalline silicon film, wherein in the peripheral transistor, the first polycrystalline silicon film is electrically connected via an opening fabricated in the insulating film to the second polycrystalline silicon film in an integral form, so as to provide a structure essentially identical to the gate of the single layer structure. However, the steps in manufacturing the memory device of JP-A-59-74677 would be complicated, since the opening must be formed at a preselected place of the insulating film located between the first polycrystalline silicon film and the second polycrystalline silicon film, which constitute the gate electrode of the peripheral transistor.

In JP-A-7-183411 and JP-A-5-48046, it is disclosed to form the floating gate and the control gate of a memory cell transistor by stacking successively the first polycrystalline silicon film, silicon oxide film and the second polycrystalline silicon film and to form the control gate of the peripheral transistor by stacking the second polycrystalline silicon film directly on the first polycrystalline silicon film. In such a case that the composite gate of the memory cell transistor and the gate electrode of the peripheral transistor are both formed of a lamination of the first and second polycrystalline silicon films, it is required to introduce an impurity such as phosphorous into the first and second polycrystalline silicon films thereby reducing the resistance of the films, since the films are also used as wiring layers. However, any of JP-A-7-183411 and JP-A-5-48046 describes nothing about this matter.

On the other hand, JP-A-2-3289 discloses a composite gate of the memory transistor which is manufactured by successively stacking a first polycrystalline silicon film into which phosphorous is doped at a low concentration, an interlayer insulating film, and a second polycrystalline silicon film into which phosphorous is doped at a high concentration.

Generally speaking, as a method for introducing an impurity such as phosphorous into the first and second polycrystalline silicon films constituting the floating gate and the control gate, there are an ion injection method in which accelerated impurity ions are injected into the polycrystalline silicon films and an vapor phase diffusion method or thermal diffusion method, in which oxyphosphorus chloride is vapored in a furnace, so that phosphorous is diffused from the vapor phase into the polycrystalline silicon films.

However, in the thermal diffusion method, since the impurity concentration is determined by the solid solution degree corresponding to the diffusion temperature, it is difficult to introduce the impurity at a low concentration into the polycrystalline silicon film. When the impurity concentration of the first polycrystalline silicon film of the memory cell transistor is increased, the boundary condition between the gate oxide film and the first polycrystalline silicon film is deteriorated, and the injection or extraction of electrons into or from the first polycrystalline silicon film of the floating gate can not be uniformly carried out, so that the memory cells fail to operate under stable condition.

On the other hand, in the ion injection method, it is difficult due to a breakage of the gate oxide film and/or occurrence of the crystal defects in the substrate to introduce the impurity into the first polycrystalline silicon film by an amount sufficient to lower its resistance. If the resistance of the first polycrystalline silicon film is not sufficiently lowered, then the resistance of the gate electrode made of the first and second polycrystalline silicon films of the peripheral transistor becomes higher. Then, if the resistance of the gate electrode becomes higher, the first polycrystalline silicon film is subjected to depletion state when the voltage is applied to the gate electrode, so that the threshold voltage of the peripheral transistor becomes unstable.

In a conventional nonvolatile semiconductor memory device in which both a memory cell transistor and another transistor other than the memory cell transistor have a two-layer polycrystalline silicon film gate structure, it is difficult to provide the polycrystalline silicon film of the under layer with an impurity concentration which satisfies the necessary condition of the memory cell transistor, as well as the condition required for the another transistor other than the memory cell transistor.

Further, the memory device of JP-A-59-74677 has a problem that since the first and second polycrystalline silicon films constituting the gate electrode disposed at an active region in the region for forming peripheral transistors are connected with each other through the opening formed at a predetermined position in the insulating film interposed therebetween, the impurities, if contained at a high concentration in the second polycrystalline silicon film, may be diffused into the first polycrystalline silicon film through the opening thereby deteriorating the boundary condition between the gate oxide film and the first polycrystalline silicon film.

SUMMARY OF THE INVENTION

An object of the present invention is to provide such a semiconductor device containing a first transistor having a composite gate structure, and a second transistor having a single gate structure. In this semiconductor device, each of the composite gate structure and the single gate structure is fabricated by a lamination of a first polycrystalline silicon film and a second polycrystalline silicon film. Also, an impurity concentration of the first polycrystalline silicon film for constructing the above-described composite gate structure, and an impurity concentration of the first polycrystalline silicon film for constituting the single gate structure can be controlled independently of each other.

According to one aspect of the present invention, a semiconductor device comprises: a first transistor having a composite gate structure containing a lamination of a first polycrystalline silicon film, an interlayer insulating film, and a second polycrystalline silicon film; and a second transistor having a single gate structure containing a lamination of a third polycrystalline silicon film and a fourth polycrystalline silicon film, wherein said first polycrystalline silicon film and said third polycrystalline silicon film have substantially the same thickness; said second polycrystalline silicon film and said fourth polycrystalline silicon film have substantially the same thickness; said first polycrystalline silicon film and said third polycrystalline silicon film have different impurity concentrations controlled independently of each other; and said second polycrystalline silicon film, said fourth polycrystalline silicon film, and said third polycrystalline silicon film have substantially the same impurity concentration.

In a preferred embodiment of the present invention, the impurity concentration of said first polycrystalline silicon film is $1 \times 10^{18}$ to $1 \times 10^{19}$ atoms/cm$^3$, and the impurity concentration of said third polycrystalline silicon film is $1 \times 10^{20}$ to $1 \times 10^{21}$ atoms/cm$^3$.

According to another aspect of the present invention, a semiconductor device comprises: a first transistor having a composite gate structure containing a lamination of a first conductive film, an insulating film, and a second conductive film; and a second transistor having a single gate structure containing a third conductive film; wherein said second conductive film and said third conductive film have substantially the same conductivity; said third conductive film has a thickness substantially the same as a total of a thickness of said first conductive film and a thickness of said second conductive film, or a total of a thickness of said first conductive film, a thickness of said insulating film, and a thickness of said second conductive film; and said first conductive film has a conductivity different from any one of a conductivity of said second conductive film and that of said third conductive film.

Furthermore, according to another aspect of the present invention, a semiconductor device comprises: a first transistor having a composite gate structure containing a lamination of a first conductive film, an insulating film formed on said first conductive film, and a second conductive film formed on said insulating film and having a conductivity different from that of said first conductive film; and a second transistor having a single gate structure containing a third conductive film having substantially the same conductivity as that of said second conductive film, and also having substantially the same thickness as a total of a film thickness of said first conductive film and a film thickness of said second conductive film, or a total of a thickness of said first conductive film, a thickness of said insulating film, and a thickness of said second conductive film.

According to one aspect of the present invention, a method for manufacturing a semiconductor device including a first transistor having a composite gate structure and a second transistor having a single gate structure, comprises the steps of: forming a first insulating film on a surface of a first region of a semiconductor substrate and forming a second insulating film on a surface of a second region of the semiconductor substrate; forming a first polycrystalline silicon film over an entire surface of said semiconductor substrate; introducing an impurity at a first predetermined concentration into said first polycrystalline silicon film by ion injection; patterning said first polycrystalline silicon film to a predetermined shape in said first region; forming a third insulating film containing at least a silicon nitride film on at least said first region except for said second region of said semiconductor substrate; forming a second polycrystalline silicon film over an entire surface of said semiconductor substrate; introducing an impurity at a second predetermined concentration higher than said first concentration into said second polycrystalline silicon film by thermal-diffusion; patterning a lamination of said second polycrystalline silicon film, said third insulating film, and said first polycrystalline silicon film into a predetermined pattern in said first region to thereby fabricate said composite gate structure of said first transistor; and patterning a lamination of said first polycrystalline silicon film and said second polycrystalline silicon film into a predetermined pattern in said second region to thereby fabricate said single gate structure of said second transistor.

Moreover, according to another aspect of the present invention, a method for manufacturing a semiconductor device including a first transistor having a composite gate structure and a second transistor having a single gate structure, comprises the steps of: forming a first insulating film on a surface of an active region disposed in a first region of a semiconductor substrate and a second insulating film on a surface of an active region disposed in a second region of the substrate; forming a first conductive film over an entire surface of said semiconductor substrate; introducing an impurity at a first predetermined concentration into said first conductive film by ion-injection; forming a third insulating film above said first conductive film at an area including at least said first region except for said second region, or an area including at least said first region and said active region of said second region except for an element isolation region of said second region; forming a conductive film over the entire surface of said semiconductor substrate; introducing an impurity at a predetermined second concentration higher than said first concentration into said second conductive film by thermal diffusion; patterning a lamination of said second conductive film, said third insulating film, and said first conductive film into a predetermined pattern to thereby fabricate said composite gate structure of said first transistor in the active region of said first region; and patterning a lamination of said first conductive film and said second conductive film into a predetermined pattern to thereby fabricate said single gate structure of said second transistor in the active region of said second region.

DESCRIPTION OF THE PREFERRED EMBODIMENTS

Referring now to FIGS. 1A through 1H, method for manufacturing an EEPROM (Electrically Erasable Read-Only Memory), according to a first embodiment of the present invention, will be described. In each of FIG. 1A to FIG. 1H, the left-sided portion represents a memory cell transistor formed in the memory cell region, whereas the right-sided portion shows a MOS transistor (peripheral transistor) fabricated in the peripheral circuit region.

Figure 1A:
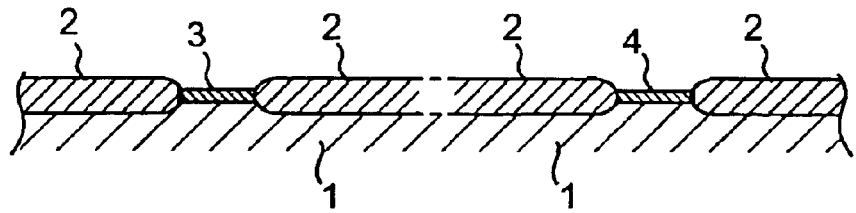
FIGS. 1A to 1H are sectional views at the respective steps of a method for manufacturing a semiconductor device according to an embodiment of the present invention.

First, to manufacture the EEPROM according to the first embodiment, as illustrated in FIG. 1A, a field oxide film 2 having a thickness of an order of 500 nm is formed on a surface of a silicon substrate 1 by the LOCOS method to provide an element isolation region. Then, a tunnel oxide film 3 having a thickness of an order of 10 to 12 nm is fabricated on the silicon substrate 1 at a memory cell region in an active region surrounded by the element isolation region made of the field oxide film 2 by way of the thermal oxidation method. Thereafter, a gate oxide film 4 having a thickness of an order of 10 to 40 nm is formed on the silicon substrate 1 at a peripheral circuit region in the active region surrounded by the field oxide film 2 by the thermal oxidation method. It should be noted that the tunnel oxide film 3 and the gate oxide film 4 may be formed in a reversed order or at the same time.

Figure 1B:
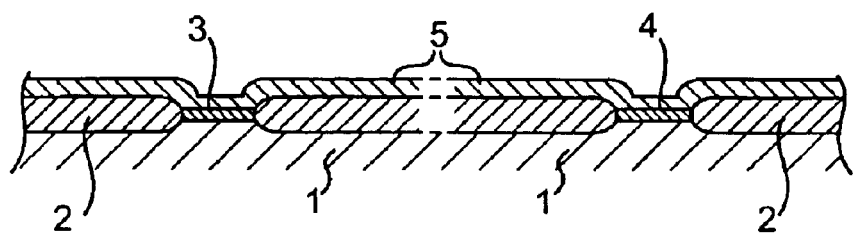

Next, as illustrated in FIG. 1B, a polycrystalline silicon film 5 having a substantially uniform thickness of an order of 150 nm is formed over the entire surface by the CVD method.

Figure 1C:
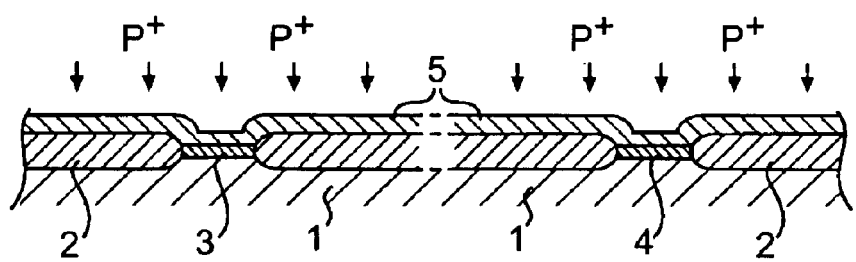
Figure 1D:
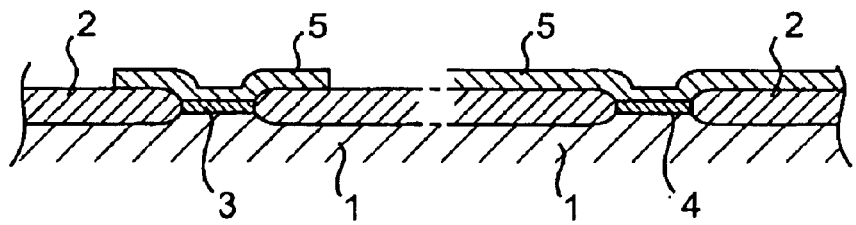

Subsequently, as indicated in FIG. 1C, phosphorus is introduced by the ion injection method into the polycrystalline silicon film 5 at an impurity concentration of an order of $1\times10^{18}$ to $1\times10^{19}$ atoms/cm$^3$. It is undesired that the impurity concentration in the polycrystalline silicon film 5 exceeds the above impurity concentration, because the boundary condition between the tunnel oxide film 3 and the polycrystalline silicon film 5 in the memory cell region is deteriorated, so that electrons are no more uniformly injected into or extracted from the polycrystalline silicon film 5 serving as the floating gate. It should be noted that instead of phosphorous, arsenic ions may be injected.

Next, as shown in FIG. 10, the polycrystalline silicon film 5 in the memory cell region is patterned to form a floating gate.

Figure 1E:
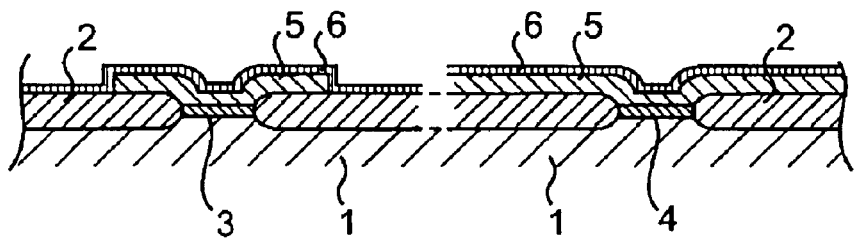

Thereafter, as indicated in FIG. 1E, an ONO film (silicon oxide film/silicon nitride film/silicon oxide film) 6 is formed over the entire surface by the CVD method. A thickness of each of the two silicon oxide film layers for constituting this ONO film 6 is in an order of 10 nm, a thickness of the silicon nitride film is in an order of 20 nm, and thus an overall thickness of the ONO film 6, as converted to an equivalent thickness of the oxide film, is in an order of 30 nm.

Figure 1F:
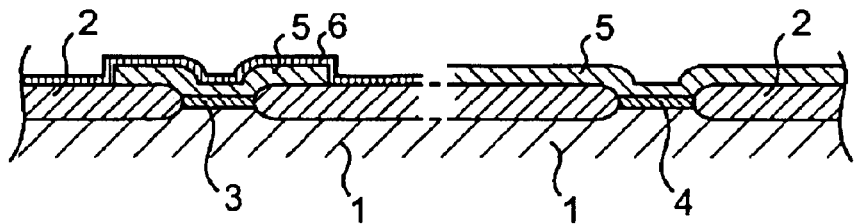

Then, as shown in FIG. 1F, an etching treatment is carried out, while using a photoresist (not shown) of a pattern covering the memory cell region as a mask, so as to remove wholly a portion of the ONO film 6 formed on the peripheral circuit region.

Figure 1G:
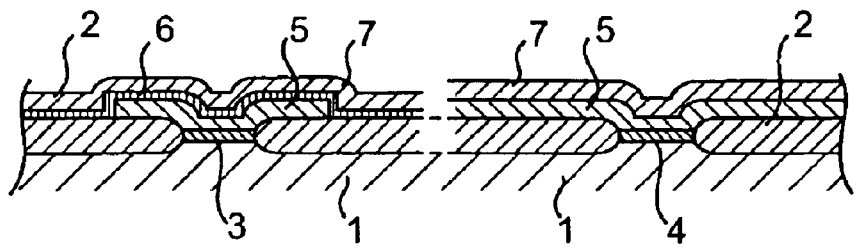

Thereafter, as indicated in FIG. 1G, a polycrystalline silicon film 7 having a uniform thickness of approximately 150 nm is fabricated over the entire surface by the CVD method.

Figure 1H:
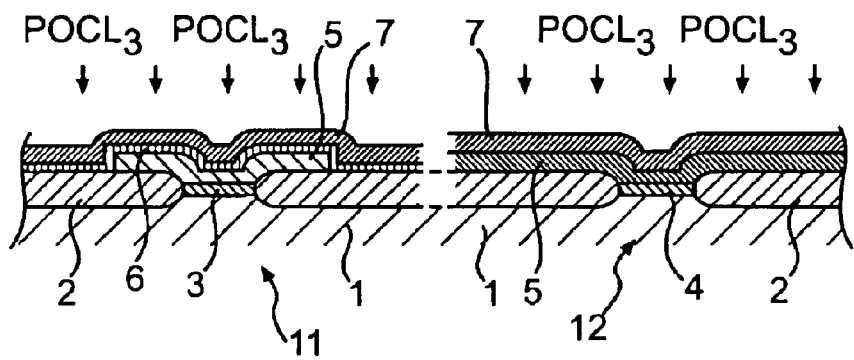

Next, as illustrated in FIG. 1H, phosphorous is diffused into the polycrystalline silicon film 7 by way of the vapor phase diffusion method by performing the thermal treatment in a furnace in which oxyphosphorus chloride ($POCl_3$: phosphoryl trichloride) is vapored. This phosphorous vapor phase diffusion is carried out until the impurity concentration of the polycrystalline silicon film 7 becomes an order of $1\times10^{20}$ to $1\times10^{21}$ atom/cm$^3$ so that the impurity concentration of the polycrystalline silicon film 7 becomes at least 10 times that of the polycrystalline silicon film 5. It should be understood that instead of phosphorous, arsenic may be diffused.

At this time, since the polycrystalline silicon film 5 is in contact with the polycrystalline silicon film 7 in the peripheral circuit region, phosphorous is also diffused from the polycrystalline silicon film 7 into the polycrystalline silicon film 5, so that the impurity concentration of the polycrystalline silicon film 5 becomes approximately $1\times10^{20}$ to $1\times10^{21}$ atoms/cm$^3$. On the other hand, the ONO film 6 containing the silicon nitride film which has a low diffusion speed of phosphorous is interposed between the polycrystalline silicon films 5 and in the memory cell region. As a result, phosphorous does not diffuse through the ONO film 6 into the polycrystalline silicon film 5 in the memory cell region. Accordingly, the impurity concentration of the polycrystalline silicon film 5 in the memory cell region remains at an order of $1\times10^{18}$ to $1\times10^{19}$ atoms/cm$^3$.

Figure 2A:
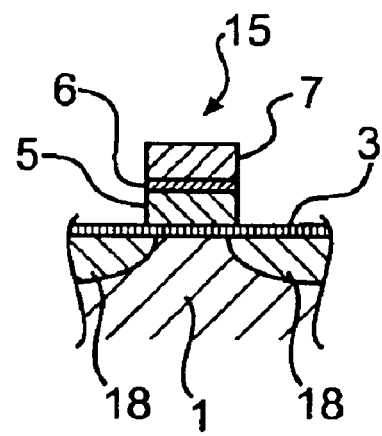
FIGS. 2A and 2B are sectional views of gate electrode portions of a memory cell transistor and a peripheral transistor in the semiconductor device of the present invention.
Figure 2B:
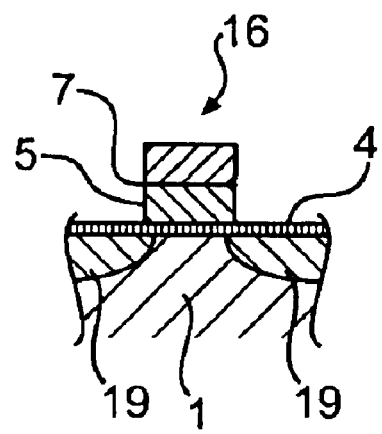

Subsequently, after photoresist (not shown) has been coated over the entire surface, this photoresist is patterned to a shape of a control gate 15 of the memory cell transistor 11 (see FIG. 2A) in the memory cell region, and also a shape of a gate electrode 16 of a peripheral transistor 12 (see FIG. 2B) in the peripheral circuit region. Then, by using the patterned photoresist as a mask, an anisotropic etching is carried out with respect to the polycrystalline silicon film 7, the ONO film 6, and the polycrystalline silicon film 5. As a result, a floating gate made of the polycrystalline silicon film 5, and a control gate made of the polycrystalline silicon film 7 are fabricated in the memory cell region, whereas a gate electrode of the peripheral transistor, which is made of the polycrystalline silicon films 5 and 7, is formed in the peripheral circuit region.

Thereafter, a step of forming impurity diffusion layers (not shown) serving as sources and drains of the memory cell transistor 11 and the peripheral transistor 12, by ion-injection using the control gate and the gate electrode as a mask, and further a step of forming an interlayer insulating film (not shown) which covers the overall areas of the memory cell transistor 11 and the peripheral transistor 12 are carried out to thereby accomplish the EEPROM.

As described above, in accordance with this first embodiment, phosphorous is introduced into the polycrystalline silicon film 5 at a relatively low concentration by way of the ion injection method and the ONO film 6 is left at least on the polycrystalline silicon film 5 of the memory cell region. Therefore, when phosphorous is introduced at a relatively high concentration into the polycrystalline silicon film 7 by way of the vapor phase diffusion method, the silicon nitride film of the ONO film 6 functions as a diffusion stopper of phosphorous. As a consequence, the impurity concentration of the polycrystalline silicon film 5 of the memory cell region can be maintained at a relatively low level, and further the impurity concentration of the polycrystalline silicon film 5 of the peripheral circuit region can be set to the relatively high level.

In this embodiment, the polycrystalline silicon films 5, 7 forming the gate electrode of the peripheral transistor, and the polycrystalline silicon film 7 forming the control gate of the memory transistor have substantially the same conductivity which is higher than the conductivity of the polycrystalline silicon film 5 forming the floating gate of the memory transistor. Also, since the polycrystalline silicon films 5 and 7 have essentially uniform sectional areas, each of the polycrystalline silicon films 5, 7 forming the gate electrode of the peripheral transistor, and the polycrystalline silicon film 7 forming the control gate of the memory transistor have substantially the same resistance.

As a consequence, the boundary between the tunnel oxide film 3 of the memory cell transistor 11 and the polycrystalline silicon film 5 can be maintained at better condition, and furthermore, the resistance of the gate electrode of the peripheral transistor 12 can be made sufficiently low. As a result, it is possible to manufacture an EEPROM having high reliability and capable of operating at high speed.

It should also be noted that in this embodiment, the ONO film 6 formed in the peripheral circuit region is completely removed in the step of FIG. 1F. Alternatively, the ONO film 6 fabricated in the peripheral circuit region may be partially removed so as to retain its portion disposed at a region where the peripheral transistor is formed. Also, in this case, since phosphorous which has been introduced by the vapor phase diffusion method is diffused into the polycrystalline silicon film 5 through a portion where the ONO film 6 was removed, the impurity concentration of the polycrystalline silicon film 5 of the peripheral circuit region can be set to a relatively high concentration. Moreover, in this case, since the film structure of the memory cell transistor 11 in the longitudinal direction is substantially identical to the film structure of the peripheral transistor 12 in the longitudinal direction, the workability can be advantageously improved in the step of forming the floating gate by applying anisotropic etching to the polycrystalline silicon film 7, the ONO film 6 and the polycrystalline silicon film 5.

Also, in this embodiment, the description has been made of a case where an MOS transistor which is formed at the same time with the memory cell transistor 11 is the MOS transistor 12 of the peripheral circuit region. Alternatively, this embodiment may be applied to such a case that, for instance, the selecting transistor selectively switching the memory cell transistor 11 in the EEPROM is fabricated at the same time with the memory cell transistor 11. Moreover, this embodiment may be applied not only to manufacturing of the EEPROM, but also any nonvolatile semiconductor memory device such as an EPROM in which each of the memory cell transistor and other transistors than the memory cell transistor uses a two-layer polycrystalline silicon film structure.

Figure 3A:
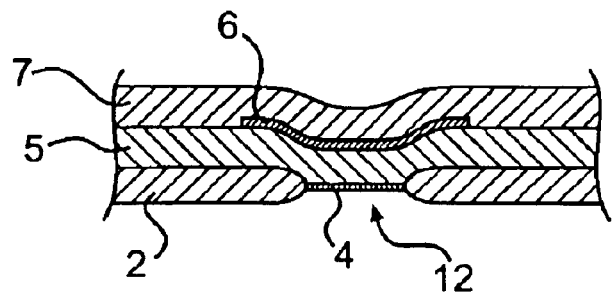
FIGS. 3A and 3B are a sectional view and a plan view, of a peripheral transistor in a semiconductor device manufactured by a method according to a second embodiment of the present invention.
Figure 3B:
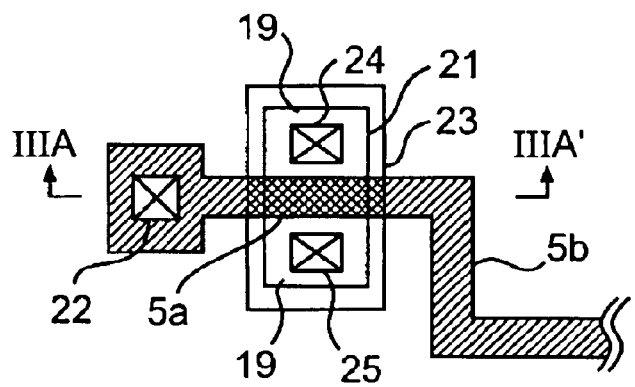
Figure 4:
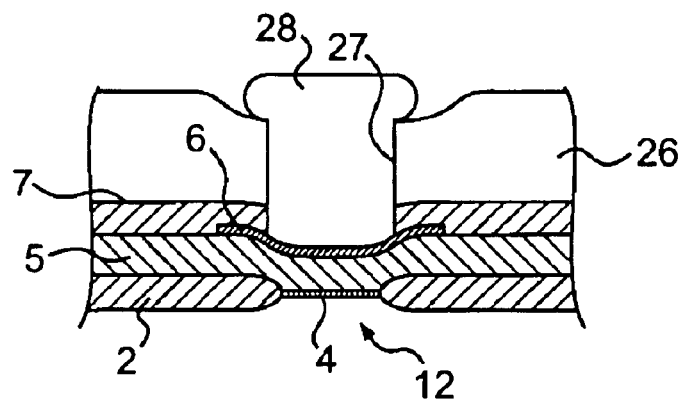
FIG. 4 shows a section of a peripheral transistor according to a third embodiment of the present invention.

Next, a second embodiment of the present invention will be explained with reference to FIGS. 3A and 3B. FIG. 3A shows a section of a portion including the gate electrode of a peripheral transistor in a step of the method of manufacturing a semiconductor device according to the second embodiment of the present invention, i.e. a section along the line IIIA to IIIA' in FIG. 3B, which is a plan view of the region including the peripheral transistor in the second embodiment.

In the second embodiment, substantially the same steps as those in the first embodiment as shown in FIGS. 1A to 1E are carried out. The second embodiment is different from the first embodiment in the step of FIG. 1F. In the first embodiment, the ONO film disposed in the region where the peripheral transistor is formed has been removed in the step of FIG. 1F. On the other hand, in the second embodiment, only a part of the ONO film disposed in the element-isolation region where the field oxide film 2 is formed is removed, while unremoving a part of the ONO film disposed in the region 23 as shown in FIG. 3B including the active region 21 where the peripheral transistor is formed by masking the region 23. Therefore, in the second embodiment, a part of the ONO film disposed on the first polycrystalline silicon film of the peripheral transistor and at an area substantially above the active region is unremoved in the step corresponding to FIG. 1F of the first embodiment. As a result, in the step of FIG. 1H where the impurity ions are introduced into the polycrystalline silicon film 7, the impurity ions are not introduced into a portion 5a (FIG. 3B) of the polycrystalline silicon film 5 disposed on the active region so that the impurity concentration of the portion 5a remains at a low level and its resistance remains at a high level. However, a portion 5b of the polycrystalline silicon film 5 disposed over the field oxide film 5 and serving as a wiring of the gate electrode has substantially the same impurity concentration as that of the polycrystalline silicon film 7, resulting in a low resistance of the portion 5b, which is effective to prevent the delay in operation of its circuit. Further, due to the same reason as that in the case of the tunnel oxide.

Incidentally, in FIG. 3E, 19 indicates the source/drain region of a peripheral transistor, 24 or 25 indicates a contact hole for connecting the source/drain region to a wiring layer (not shown) and 22 indicates a contact hole for connecting the gate electrode of the peripheral transistor to a wiring layer (not shown).

As previously described, according to the present invention, since the impurity is introduced at a relatively low concentration into the first polycrystalline silicon film by ion-implantation and also the insulating film containing the silicon nitride film is left on the polycrystalline silicon film in the memory cell region, when phosphorous is introduced at a relatively high concentration into the second polycrystalline silicon film by way of the thermal diffusion method, the silicon nitride film functions as a stopper for diffusion of the impurity. As a consequence, the impurity concentration of the first polycrystalline silicon film of the memory cell region can be maintained at a relatively low level, and further the impurity concentration of the first polycrystalline silicon film of the peripheral transistor can be set to a relatively high level.

As a result, the boundary between the tunnel oxide film (first insulating film) of the memory cell transistor formed in the memory cell region and the first polycrystalline silicon film can be maintained at better condition, and furthermore, the resistance of the gate electrode wiring of the MOS transistor formed in the peripheral region can be made sufficiently low. As a result, it is possible to manufacture a nonvolatile semiconductor memory device having high reliability and capable of operating at high speed.

What is claimed is:

1. A semiconductor device comprising:
   a lamination of a firs: conductive film and a second conductive film, said lamination extending on an active region and an element isolation region of a semiconductor substrate;
   wherein said first conductive film is facing to said second conductive film in said active region with an insulating film interposed therebetween and in face-to face contact with each other over said element isolation region; and
   said lamination is patterned into respective predetermined patterns in said active region and said element isolation region.

2. A semiconductor device as claimed in claim 1, wherein said first conductive film includes a first silicon film and said second conductive film includes a second silicon film.

3. A semiconductor device as claimed in claim 1, wherein said second insulating film includes a nitride film.

4. A semiconductor device as claimed in claim 1, wherein said second insulating film is a multilayer insulating film containing an oxide film and a nitride film.

5. A semiconductor device as claimed in claim 1, in said second conductive film is formed immediately above an entire surface of said first conductive film in said element isolation region.

6. A semiconductor device as claimed in claim 1, wherein said insulating film is formed immediately above said first conductive film and said second conductive film is formed immediately above said insulating film in said active region.

7. A semiconductor device as claimed in claim 1, wherein an impurity is introduced into maid first conductive film at a concentration of $1\times10^{18}$ to $1\times10^{19}$ atoms/cm$^3$ in said active region, and an impurity is introduced into said second conductive film at a concentration of $1\times10^{20}$ to $1\times10^{21}$ atoms/cm$^3$ in said active region.

8. A semiconductor device as claimed in claim 1, wherein an impurity is introduced at a concentration $1\times10^{20}$ to $1\times10^{21}$ atoms/cm$^3$ into each of said first conductive film and said second conductive film in said element isolation region.

9. A semiconductor device as claimed in claim 1, wherein said first conductive film has a conductivity lower than that of said second conductive film in said active region.

10. A semiconductor device as claimed in claim 1, wherein said first conductive film has substantially the same conductivity as that of said second conductive film in said element isolation region.

11. A semiconductor device as claimed in claim 1, wherein said semiconductor device is an MOS transistor.

12. A semiconductor device as claimed in claim 1, wherein a second insulating film is formed on a surface of said active region of said semiconductor substrate; and said first conductive film is formed on said second insulating film: and said semiconductor device further comprises source/drain regions formed at both aides of said first conductive film in said active region.

13. A semiconductor device as claimed in claim 1, further comprising an interlayer insulating film formed over said second conductive film fanned above said active region; a contact hole formed in said interlayer insulating film so as to reach said second conductive film but not to exceed said insulating film formed between said first and second conductive films formed in said active region; and a wiring layer formed on said interlayer insulating film and electrically connected through said contact hole to said second conductive film.

* * * * *